United States Patent
McCollough et al.

[11] Patent Number: 6,121,849
[45] Date of Patent: Sep. 19, 2000

[54] OSCILLATOR AMPLIFIER WITH FREQUENCY BASED DIGITAL MULTI-DISCRETE-LEVEL GAIN CONTROL AND METHOD OF OPERATION

[75] Inventors: Kelvin Edward McCollough; Boaz Kochman, both of Austin, Tex.

[73] Assignee: Motorola Inc., Schaumburg, Ill.

[21] Appl. No.: 09/121,700

[22] Filed: Jul. 24, 1998

[51] Int. Cl.[7] .............................. H03B 5/00; H03L 3/00
[52] U.S. Cl. ........................ 331/175; 331/34; 331/74; 331/DIG. 2; 331/1 R; 331/177 R
[58] Field of Search ................... 331/158, 108 C, 331/109, 183, 175, 177 R, 74, DIG. 2, 34, 116 R, 1 R, 116 FE; 327/47

[56] References Cited

U.S. PATENT DOCUMENTS

| | | | |
|---|---|---|---|
| 4,896,122 | 1/1990 | Tahernia et al. | 331/158 |
| 4,956,618 | 9/1990 | Ulmer | 331/116 FE |
| 5,481,228 | 1/1996 | Badyal | 331/74 |
| 5,852,387 | 12/1998 | Brakus et al. | 331/111 |
| 5,912,593 | 6/1999 | Susak et al. | 331/111 |

*Primary Examiner*—Arnold Kinkead

[57] ABSTRACT

An integrated circuit (11) has a frequency detection circuit (22) which provides one or more digital signals (50) to a current source (26) based upon a detected frequency of operation of a generated reference clock (48). The signals (50) allows the current source (26) to change its operational state between two or more discrete current output levels in a digitally-controlled manner. Using signals (50), a high current output level can selected and provided by the current source (26) to the external oscillator circuit (16) during a start up mode to ensure that the integrated circuit (11) can start up in an optimally reduced time period. After a start up operation is complete, the signals (50) can then be used to switch the current source (26) into a lower current operational mode whereby electromagnetic interference (EMI) effects are reduced during the normal modes of operation occurring after start up.

22 Claims, 2 Drawing Sheets

OSCILLATOR AMPLIFIER WITH FREQUENCY BASED DIGITAL MULTI-DISCRETE-LEVEL GAIN CONTROL AND METHOD OF OPERATION

REFERENCE TO CO-PENDING APPLICATIONS

The present invention is related to the following co-pending applications for patent:

"Method and Apparatus for Managing Failure of a System Clock in a Data Processing System" by Kelvin E. McCollough et al., filed Aug. 18, 1997, having application Ser. No. 8,916,733, now U.S. Pat. No. 5,903,748 and assigned to the assignee hereof;

"Dual Bandwidth Phase Locked Loop Frequency Lock Detection System and Method" by Kelvin McCollough, filed Aug. 4, 1997, having application Ser. No. 8,905,336, and assigned to the assignee hereof.

FIELD OF THE INVENTION

The present invention relates generally to integrated circuits, and more particularly, to an oscillator amplifier having digital gain control whereby the gain of the oscillator amplifier may be switched between discrete gains to improve integrated circuit performance.

BACKGROUND OF THE INVENTION

In the integrated circuit (IC) industry, integrated circuits need square-wave repeating clock signals to execute software and perform other useful operations. To enable creation of these clock signals, integrated circuits have external terminals which are connected to crystal oscillator circuitry. The crystal oscillator circuitry typically contains a crystal oscillator component along with one or more passive elements such as capacitors, resistors, and the like. This crystal oscillator circuit provides the sinusoidal repeating signals to the IC so that IC square-wave clocks may be created and routed to all functional circuitry within the IC. In order to charge the oscillator circuit's capacitors and start the crystal oscillator, an electrical signal (e.g., current) is typically communicated from the integrated circuit to the external oscillator circuitry. Due to the inherent nature of crystal oscillators and the capacitors they are coupled to during operation, stable crystal oscillation and clock generation consumes a significant amount of time during the "start up" procedure of an IC.

In the prior art, a current source internal to the integrated circuit which powers the external oscillator circuitry during "start up" is statically configured. In one form of this prior art embodiment, the internal current source is statically configured to provide a high current all the time (i.e., during both the start up period of the integrated circuit and during the IC's normal mode of operation). When this current source is providing high current constantly, the start up time of the integrated circuit is minimized or rendered optimal since the higher current powers the external oscillator circuit at a faster rate. However, the electromagnetic interference (EMI) is typically too high when ICs use static high oscillator current whereby electrical operation of adjacent circuitry is impeded.

In another form, the internal current source of the integrated circuit may be statically set to provide low current at all times. When using this low-current design, the integrated circuit has reduced electromagnetic interference (EMI), but will typically have a lengthy start up time which is unacceptable in most systems. Therefore, a statically configured high current source and/or a statically configured low current source for use with oscillator circuitry is disadvantageous for most modern applications.

In order to overcome the above disadvantages, integrated circuits are now being designed with automatic gain control (AGC) circuitry of circuitry that is also referred to as automatic level control (ALC) circuitry. This AGC and/or ALC circuitry is complex analog circuitry that replaces the statically configured current source discussed previously. The AGC or ALC is an analog circuit that monitors the amplitude of the oscillator signal and continuously adjusts the current of the oscillator amplifier until an optimal oscillator amplitude is obtained for a given IC device. The AGC/ALC circuitry does not have discrete and static current levels as does the prior art, and changes current levels based on amplitude of the oscillator signal. The AGC or ALC circuitry will consume a significant size of the integrated circuit and is a costly circuit to design and manufacture. In addition, since the AGC and/or ALC circuitry is analog in nature, environmental and process variations may affect the performance and operation of these circuits. Most AGC/ALC circuits are not process scalable. While these AGC/ALC circuits are complex, more expensive, not very scalable, and consume a significant silicon surface area, these circuits allow for continuous current control of the oscillator circuitry so that start up time is somewhat improved while EMI effects are reduced.

Therefore, a need exists in the industry for an improved clock generation circuit which reduces EMI effects and improves start up time, while simultaneously providing a less complex solution which consumes less surface area and is more cost effective than previous analog solutions.

DESCRIPTION OF A PREFERRED EMBODIMENT

Generally, the present invention is an integrated circuit (IC) system and method for driving an external oscillator circuit using a frequency-triggered digitally-programmable current source. The integrated circuit contains a frequency detector or loss of clock (LOC) detector which is continually monitoring the oscillations of the external oscillator. During a "start up" procedure or during periods where the clock is not properly functioning, the loss of clock (LOC) detector will output a control signal in a first binary state. This first binary state of the control signal is provided to a current source within the integrated circuit whereby the current source is configured to a high current output state in response to the first binary state. Therefore, when a "start up", reset, or "recovery" operation is initiated, a current of the oscillator amplifier can be increased in a digital and discrete manner to facilitate quick start up and/or recovery of the oscillator circuit.

During time periods when the clock is properly functioning in a normal mode of operation, the loss of clock (LOC) frequency detector will communicate a second binary state to the current source via the control signal. This second binary state will switch the current source of the oscillator amplifier into a lower current mode whereby a lower current is provided to the external oscillator circuit. This lower current will maintain the external oscillator circuit in an operational state while providing the low current needed to ensure that electromagnetic interference (EMI) effects are reduced for the integrated circuit system.

Therefore, the discrete digitally programmed current source within the oscillator amplifier herein is much simplified over the automatic gain control (AGC) and automatic level control (ALC) analog solutions of the prior art. The solutions taught herein will further have reduced complexity, reduced circuit size, reduced cost, improved process scalability, and reduced sensitivity to process variations and/or environmental variations. Finally, the circuit taught herein will significantly improve a start up time of the integrated circuit while simultaneously ensuring that various adverse electromagnetic interference (EMI) effects within the electrical system are also reduced.

Figure 1:
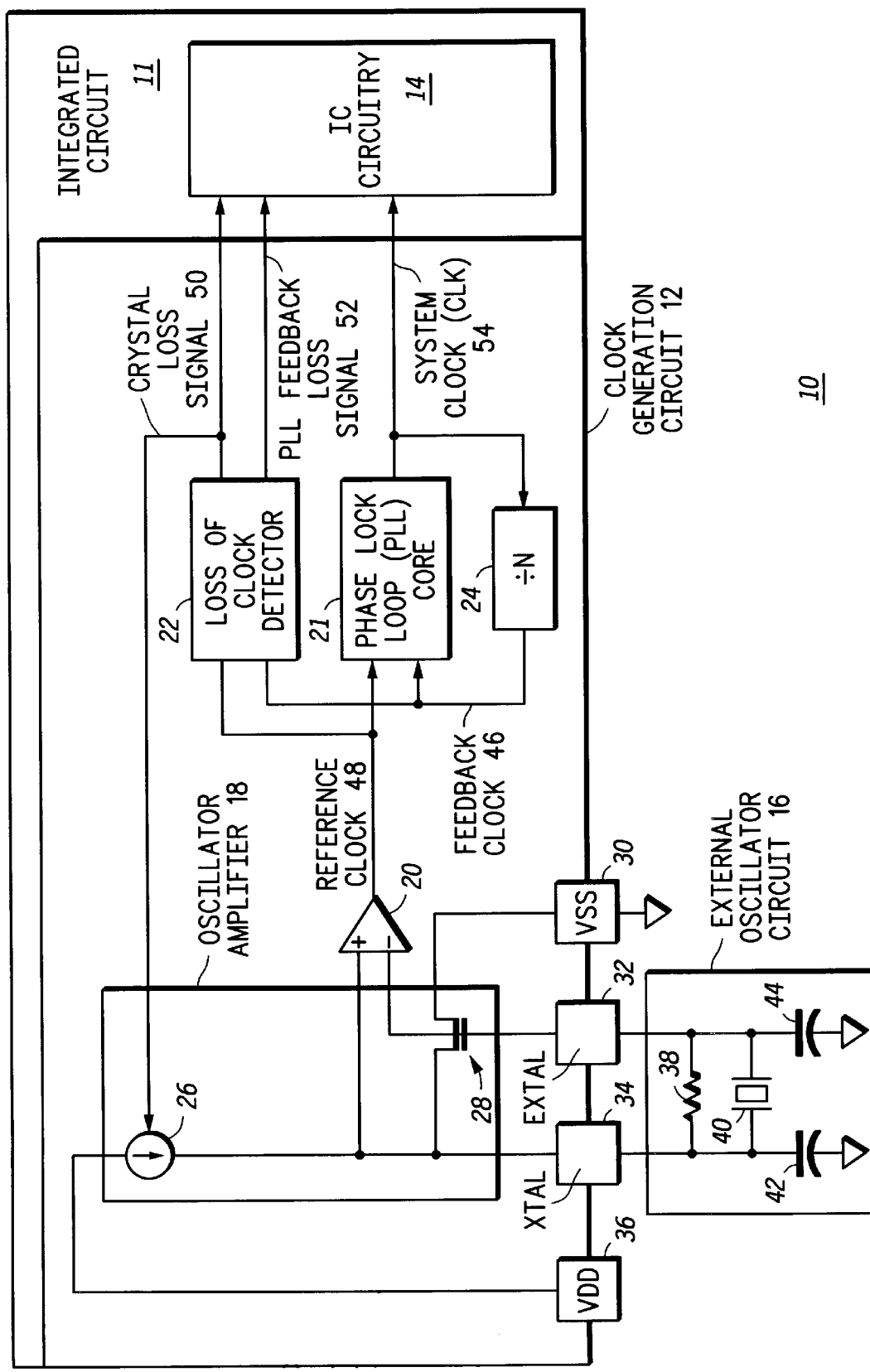
FIG. 1 illustrates, in a circuit diagram, an integrated circuit (IC) made in accordance with the present invention.
Figure 2:
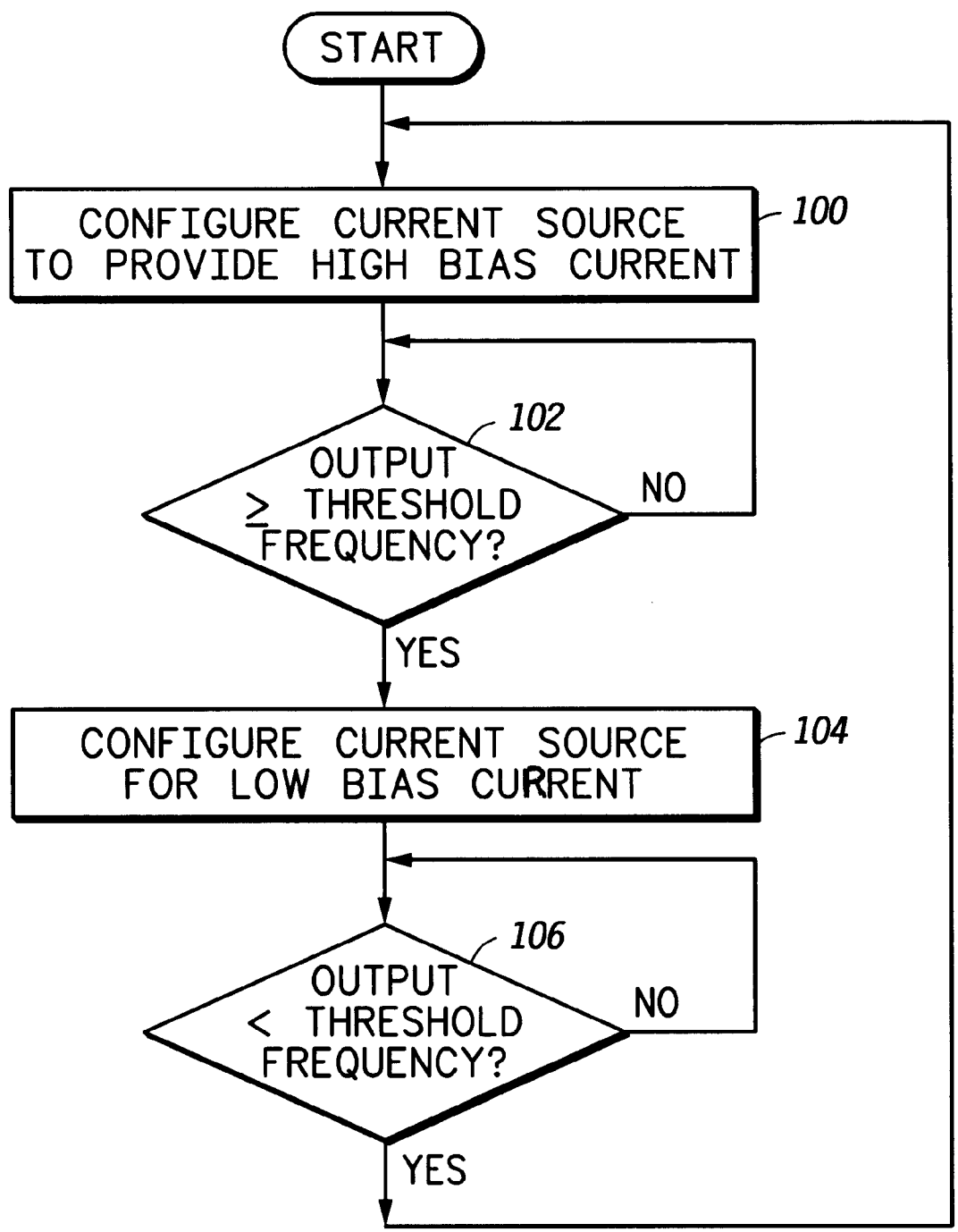
FIG. 2 illustrates, in a flow chart, a method for operating the integrated circuit (IC) of FIG. 1 in accordance with the present invention.

The invention can be further understood with reference to FIGS. 1 and 2.

FIG. 1 illustrates an electrical system 10 comprising an integrated circuit 11 and an external oscillator circuit 16. The integrated circuit 11 generally contains a clock generation circuit 12 which is coupled to IC circuitry 14. IC circuitry 14 is any circuitry other than the clock generation circuitry 12 which can be integrated into a single IC package along with the circuit 12. As an example, the IC circuitry 14 may contain one or more of a CPU core, cache controllers, various memory devices such as static random access memory (SRAM), embedded dynamic random access memory (DRAM), non-volatile memory, or the like, an A/D converter, a D/A converter, timers, gate arrays, transducers, power devices, other peripheral devices, discrete components, micromachined devices, or other types of electronic or electromechanical devices. The circuitry 14 is coupled to receive, as input, the signals 50, 52, and 54 that are output from the circuit 12 in FIG. 1.

Clock generation circuit 12 has four external terminal connections illustrated in FIG. 1. Circuit 12 has a terminal 36 for receiving a voltage power supply (VDD). Circuit 12 contains two external terminals 34 and 32 for receiving an oscillator output signal. Specifically, terminal 34 in FIG. 1 is referred to as an XTAL terminal and terminal 32 of FIG. 1 is referred to as an EXTAL terminal where both these terminals provide a means for generating sinusoidal oscillating crystal-based signals. FIG. 1 illustrates that an external terminal 30 of the integrated circuit 11 is provided to enable connection to a ground signal (VSS). The terminals 30–36 may be external terminals of an IC package (e.g., pins or conductive bumps) or may be conductive interconnections within a multi-chip module (MCM). In addition to the four terminals, the clock generation circuit 12 provides three output signals for use within the integrated circuit 11. FIG. 1 specifically illustrates a crystal loss signal 50, a phase-locked-loop (PLL) feedback loss signal 52, and a system clock (CLK) signal 54.

An oscillator amplifier 18 resides within the circuit 12 of FIG. 1. The oscillator amplifier 18 contains a current source 26 and a gain device 28. Specifically, the device 28 of FIG. 1 is a single N-channel metal oxide semiconductor (NMOS) transistor. However, the device 28 of FIG. 1 may be replaced with any other device that has the ability to provide gain such as an inverter, a logic gate (e.g., NAND gate), a PMOS transistor, a bipolar device, a plurality of these devices, and/or the like.

As illustrated in FIG. 1, a gate of the NMOS device 28 is coupled to receive the crystal signal from the EXTAL terminal 32, a first current electrode of the device 28 is coupled to ground through the VSS terminal 30, and a second current electrode of the device 28 is coupled to receive a crystal signal from the XTAL terminal 34 in FIG. 1. The current source 26 of FIG. 1 is coupled between the VDD terminal 36 and the XTAL terminal 34. In addition, the current source 26 is coupled to receive the crystal loss signal 50 as a control input. In FIG. 1, the crystal loss signal 50 is a single binary conductive line that communicates at least either a logic zero or a logic one. In other embodiments, the crystal loss signal 50 may be a bus of two or more binary conductive lines whereby the current source 56 can accept multiple digital control signals. In this case, the current source 26 will contain a more complex decoder or D/A converter that performs more complicated binary decoding and current output control.

FIG. 1 illustrates that the circuit 12 contains a comparator 20. The comparator 20 has a positive terminal coupled to receive the signal from the XTAL terminal 34 and a negative terminal coupled to receive the crystal oscillator signal from the terminal EXTAL 32. The comparator 20 takes these two input signals, which are sinusoidal signals that are 180° out of phase for each other, and drives a rail-to-rail (VDD-to-VSS) square wave reference clock signal 48 in FIG. 1. When fully operational, the frequency of reference clock 48 is a same or substantially similar to the frequency of the two complementary input signals provided to the comparator 20. Generally, the output 48 is flat-lined or non-oscillating until a threshold amplitude or threshold power is obtained as input to the comparator 20.

The reference clock 48 is coupled to a phase-locked-loop (PLL) circuit 21 and a loss of clock (LOC) detector circuit 22. The phase-locked-loop core 21 is circuitry that is responsible for providing a system clock (CLK) 54 to the entire integrated circuit 11 including the IC circuitry 14. Generally, an analog phase-locked-loop (PLL) circuit will comprise a feedback path. The feedback path is illustrated in FIG. 1 as being a divide by N circuit 24 that provides a feed back signal 46. Generally, the phase-locked-loop circuit 21 will synchronize the reference clock 48 to the feedback clock 46 wherein the reference clock 48 and the feedback clock 46 are operating at or around an identical or near identical frequency. In addition to performing synchronization operations, the circuit 21 will frequency multiply the synchronized signal by a factor of N to output a square wave system clock 54 which is operating at a frequency N times that of the reference clock 48. The system clock 54 which is operating at a frequency N times greater than the reference clock 48 is divided by the factor N to provide the closed-loop feedback clock 46 in FIG. 1 which is of the same frequency as reference clock 48.

The loss of clock (LOC) detect circuitry 22 receives the feedback clock 46 and the reference clock 48 as inputs. If the reference clock 48 were to fail for any reason, then the crystal loss output signal 50 would be asserted to a logic one value. Specifically, the circuit 22 is set to recognize a threshold frequency. For microcontroller unit (MCU) applications, the threshold frequency is set to a value between 100 kHz and 250 kHz. In general, this threshold frequency can be set to any frequency depending upon the specific application (i.e., some CPUs require high frequencies while some CPUs require slower frequencies). If the reference clock 48 is operating at a frequency less than this reference frequency or is flat-lined (i.e., no signal whatsoever or tri-stated), then the crystal loss signal 50 is asserted to a logic one. If the reference clock 48 is operating at or above this threshold frequency, then the crystal loss signal 50 is deasserted to a logic zero. In addition, the loss of clock (LOC) detection circuit 22 will perform the same operation for the feedback clock 46. If the feedback clock 46 is operating at a frequency less than a threshold frequency, then the PLL feedback loss signal 52 is asserted. If the feedback clock 46 is operating above the threshold frequency, then the PLL feedback loss signal 52 is deasserted.

FIG. 1 illustrates the external oscillator circuit 16 as it is connected to the integrated circuit (IC) 11. While many different oscillator circuits may be used in FIG. 1, circuit 16 shows a specific oscillator circuit having a resistor 38 connected across the terminals 32 and 34. In parallel to this resistor or resistive device 38, a crystal 40 is connected. A capacitor 42 is connected between a first terminal of the oscillator and a ground signal (VSS). A second capacitor 44 is connected between a second terminal of the oscillator and a ground signal (VSS). Generally, the resistor 38 is any resistor within a range of roughly 1–10 MΩ, the crystal oscillator 40 is any crystal having a frequency of operation within roughly 2–20 MHz. And the capacitors 42 and 44 are capacitors having capacitances values between roughly 2 pF and 50 pF.

While FIG. 1 illustrates the structure of the circuit, FIG. 2 illustrates how the circuit of FIG. 1 operates to improve start-up time while reducing EMI effects during normal modes of operation.

FIG. 2 illustrates in a flow chart containing the steps 100–106. In FIG. 2, upon one or more of a "start up" event, integrated circuit reset command, low power recovery event, or a loss of clock (LOC) event, the loss of clock detector circuit 22 will be outputting a logic 1 value for the crystal loss signal 50 since the reference clock 48 will be operating at a frequency that is less than a threshold frequency. This logic 1 communicated via signal 50 will configure the current source of FIG. 1 to provide a high current as in step 100 of FIG. 2. Specifically, when the oscillator 40 is being reactivated or when the oscillator 40 is being placed into a power-on state for the first time, the reference clock 48 is, at first, a flat line signal. When the reference clock 48 is a flat line signal, the loss of clock (LOC) detection circuit 22 will output an asserted crystal loss signal 50. This asserted crystal loss signal 50 is fed back into the current source 26 as shown in FIG. 1. The asserted signal 50 will configure the current source 26 via a step 100 in FIG. 2 to provide a high output current. In one embodiment, a high current provided by the current source 26 will be some discrete static current within a range of roughly 500 microamperes to 3 milliamperes.

The high current provided by the device 26 in step 100 will allow the capacitors 42 and 44 and the oscillator 40 to be charged and become functional in a very short time period (e.g., 2–5 milliseconds or less). By recognizing the necessity to quickly recharge or "start up" the circuit 16 via a frequency detection scheme which enables higher "start up" current, the overall start up time of the integrated circuit 11 can be drastically reduced. As long as no proper frequency or signal is detected on the line 48, the high current is maintained out of the device 26 via the asserted signal 50 as shown via step 102 of FIG. 2.

Once the oscillator 40 is properly functioning/charged and the comparator 20 is properly providing a reference clock 48, the loss of clock detection circuitry 22 will deassert the signal 50 since the clock is being properly detected in a step 104. Once the signal 50 is set to a logic zero and the reference clock 48 is properly functioning, the current source 26 is configured to provide the lower current to the external oscillator circuit 16. This lower current is typically some current within the range of 100 microamperes and 500 microamperes. Therefore, FIG. 2 indicates that while the threshold frequency is not obtained on the reference clock 48, the high current output of the current source 26 is maintained via steps 100 and 102. However, once the frequency is properly obtained on the reference clock signal 48, the deassertion of the crystal loss signal 50 will result in a shift of the current output of the current source 26 to a lower output current as indicated in step 104 of FIG. 2. Once the crystal loss signal 50 is deasserted and the current source 26 is operating in a low current mode, the signal 50 and current source 26 will be operated in this state until the circuit 22 once again detects a loss of clock via step 104. If this loss of clock (LOC) is detected in a step 106 of FIG. 2, then the signal 50 is reasserted via step 100, and the current source 26 is once again shifted into a high current mode.

It is important to note that the digitally-controlled current source 26 that outputs discrete levels of current based upon frequency detection is a much simpler solution than the automatic gain control (AGC) or automatic level control (ALC) designs used currently in the prior art. Due to this increased simplicity, the complexity of the design, the size of the design, and the cost of the design will be significantly reduced. In addition, since there is digital control placed between the circuit 22 and the current source 26, the circuit 26 can be made with fewer analog components and will not have the sensitivity to process variations and environmental variations that affect other analog solutions. In addition, the process scalability of the design of FIG. 1 is improved over the prior art.

In addition, the design of FIG. 1 allows the current source 26 to provide high current during start up periods and during loss of clock events whereby recovery of the crystal 40 and starting of the internal clock 54 (CLK) can be performed in a very time effective manner. In addition to improving start up time of the integrated circuit 11 via digitally-controlled high current, the digitally programmable current source 26 will output lower currents, based upon frequency detection, during normal modes of operation to reduce the electromechanical interference (EMI) effects that the integrated circuit 11 has on surrounding electrical systems and power busses.

It is important to note that FIGS. 1–2 illustrates only one potential embodiment. In an alternate embodiment, the frequency detector 22 can provide two or more binary signals as crystal loss signal 50 to the current source 26. In this case, the current source 26 will contain a more complicated decode circuit or a D/A converter which will provide not just high and low current level but a plurality of discrete current levels (e.g., three or more current levels).

This type of functionality is useful for integrated circuits that may be operating at different VDD potentials. A VDD potential of 5.0 volts may require a higher current level during start up than an integrated circuit operating at 3.3 volts, 2.5 volts, 1.8 volts or some lower VDD voltage. By providing a more complex decoding scheme between the circuit 22 and the current source 26 with more than two unique binary states, the integrated circuit 11 can intelligently compensate for changes in the power supply voltage VDD without requiring a redesign effort. In this multi-bit frequency-controlled approach, the circuit will settle at an optimal high current levels during start up periods and at optimal EMI-reducing low current levels during normal modes of operation either under automatic control or by preprogrammed selection (e.g., setting EPROM bits in the device).

In addition, for this same alternate embodiment, the integrated circuit 11 may be connected at any time to different oscillators 40 that could vary orders of magnitude in operating frequency. Higher frequency oscillators 40 generally require less current out of the current source 26 during start up. A more complicated multi-bit decoding scheme between the circuit 22 and 26 can easily alter current levels, in a selectable and programmable manner, for such changes in the frequency of the oscillator 40 so that start up times remain within a specified minimum tolerance.

In another embodiment, FIG. 1 illustrates a method for controlling the gain of the oscillator amplifier 18 by changing the current (I) supplied to a single device 28. It should be noted that the circuit 18 of FIG. 1 can be changed so that the current source 26 provides a constant current while the signal 50 may be used to change or switch in and/or out other devices to affect the aspect ratio of the device 28 to accommodate different gains at different times during the operation of the integrated circuit.

Although the invention has been described and illustrated with reference to specific embodiments, it is not intended that the invention be limited to those illustrative embodiments. Those skilled in the art will recognize that modifications and variations may be made without departing from the spirit and scope of the invention. Therefore, it is intended that this invention encompasses all the variations and modifications as fall within the scope of the appended claims.

What is claimed is:

1. A method for operating an integrated circuit, the method comprising the steps of:

providing the integrated circuit, the integrated circuit having an oscillator amplifier, the oscillator amplifier adapted to receive an oscillator signal;

configuring the oscillator amplifier to obtain a first gain;

generating a reference clock signal based on the first gain;

providing a first frequency signal to track the reference clock;

maintaining the first gain within the oscillator amplifier while the reference clock signal is approximately below a threshold oscillator frequency;

reconfiguring the oscillator amplifier to obtain a second gain.

2. The method as in claim 1, wherein the steps of configuring and re-configuring the oscillator amplifier comprise the step of providing a current source to generate a gain.

3. The method as in claim 2, wherein the current source has a selectable discrete magnitude.

4. The method of claim 3, wherein the selectable discrete magnitude is programmable.

5. The method of claim 3, wherein the step of re-configuring comprises the steps of:

determining if the reference clock signal falls below the threshold oscillator frequency as indicated by the first frequency signal; and in response to the reference clock signal falling below the threshold oscillator frequency, re-configuring the oscillator amplifier to obtain the first gain within the oscillator amplifier.

6. The method of claim 1, wherein the step of re-configuring comprises the steps of:

determining if the reference clock signal falls below the threshold oscillator frequency; and in response to the reference clock signal falling below the threshold oscillator frequency, re-configuring the oscillator amplifier to obtain the first gain within the oscillator amplifier.

7. The method of claim 1, further comprising the step of:

providing feedback to the oscillator amplifier based on the first frequency signal.

8. The method of claim 7, wherein the feedback is used to reconfigure the oscillator amplifier.

9. The method of claim 1, whereby electromagnetic interference is reduced using the second gain as compared to using the first gain.

10. The method of claim 1, wherein the threshold oscillator frequency is between 100 kiloHertz and 250 kiloHertz.

11. The method of claim 1, wherein the reference clock signal is based on the first gain for a first time period.

12. The method of claim 11, wherein the first time period is approximately less than 5 milliseconds.

13. The method of claim 1, further comprising the steps of:

generating a reference clock signal based on the second gain;

maintaining the second gain within the oscillator amplifier while the reference clock signal is approximately below a second threshold oscillator frequency; and re-configuring the oscillator amplifier to obtain a third gain.

14. The method of claim 1, wherein the first gain and the second gain are programmable.

15. The method of claim 1, wherein the first gain and the second gain are based on a supply voltage level supplied to the integrated circuit.

16. A clock generation circuit, the clock generation circuit adapted to provide a clock output signal, the clock generation circuit comprising:

an oscillator amplifier adapted to receive an oscillator signal and to provide a reference clock signal, the oscillator amplifier configured to obtain a first gain, wherein the first gain is adjustable based on a frequency of the reference clock signal; and a frequency detector adapted to receive the reference clock signal, the frequency detector adapted to detect a threshold frequency and provide a feedback signal to the oscillator amplifier;

wherein the first gain is adjustable to one of a plurality of discrete gain levels.

17. The clock generation circuit of claim 16, wherein the oscillator amplifier comprises:

a first active element; and a loading device coupled to the first active element, wherein the loading device is responsive to the feedback signal.

18. The clock generation circuit of claim 17, wherein the loading device comprises a current source.

19. The clock generation circuit of claim 16, further comprising: a clock generator adapted to provide a clock output signal based on the reference clock signal.

20. The clock generation circuit of claim 16, wherein the oscillator amplifier comprises:

a current source; and a plurality of active elements coupled to the current source, wherein a first configuration of said plurality of active elements produces a first one of the plurality of discrete gain levels and a second configuration of said plurality of active elements produces a second one of the plurality of discrete gain levels.

21. The clock generation circuit of claim 20, wherein the plurality of discrete gain levels are programmable.

22. The clock generation circuit of claim 16, further comprising:

a phase-locked-loop circuit adapted to provide an output system clock signal, the phase-locked-loop having a feedback clock frequency;

wherein the frequency detector is adapted to detect when the feedback clock frequency is approximately below a target level and in response provide a phase-locked-loop indicator signal.

* * * * *